United States Patent
Rajendran et al.

(10) Patent No.: US 10,073,728 B2
(45) Date of Patent: Sep. 11, 2018

(54) SYSTEM, METHOD AND COMPUTER-ACCESSIBLE MEDIUM FOR FAULT ANALYSIS DRIVEN SELECTION OF LOGIC GATES TO BE CAMOUFLAGED

(71) Applicant: New York University, New York, NY (US)

(72) Inventors: Jeyavijayan Rajendran, Brooklyn, NY (US); Ozgur Sinanoglu, Abu Dhabi (AE); Ramesh Karri, New York, NY (US)

(73) Assignee: New York University, New York, NY (US)

( * ) Notice: Subject to any disclaimer, the term of this patent is extended or adjusted under 35 U.S.C. 154(b) by 102 days.

(21) Appl. No.: 14/917,456

(22) PCT Filed: Sep. 10, 2014

(86) PCT No.: PCT/US2014/054911
§ 371 (c)(1),
(2) Date: Mar. 8, 2016

(87) PCT Pub. No.: WO2015/038587
PCT Pub. Date: Mar. 19, 2015

(65) Prior Publication Data
US 2016/0224407 A1    Aug. 4, 2016

Related U.S. Application Data

(60) Provisional application No. 61/876,298, filed on Sep. 11, 2013.

(51) Int. Cl.
G06F 17/50 (2006.01)
G06F 11/07 (2006.01)
(Continued)

(52) U.S. Cl.
CPC ...... *G06F 11/0793* (2013.01); *G01R 31/3177* (2013.01); *G06F 11/0706* (2013.01);
(Continued)

(58) Field of Classification Search
CPC .................................................. G06F 17/5068
(Continued)

(56) References Cited

U.S. PATENT DOCUMENTS 5,783,846 A * 7/1998 Baukus ............... G11C 7/24
257/204
6,190,433 B1 2/2001 Van Fleet et al.
(Continued)

OTHER PUBLICATIONS

International Search Report for International Application No. PCT/US2014/054911 dated Dec. 18, 2014.
(Continued)

*Primary Examiner* — Suchin Parihar
(74) *Attorney, Agent, or Firm* — Hunton Andrews Kurth LLP

(57) ABSTRACT

Exemplary systems, methods and computer-accessible mediums can be provided that can, for example, determine a camouflaging location(s) of the logic gate(s) using a fault analysis procedure, and can camouflage the logic gate(s) at the location(s) based on the determination. The camouflaging procedure can be performed by replacing the logic gate(s) at the camouflaging location(s) with a further camouflaged gate, which can have a dummy contact(s) or a vias.

21 Claims, 7 Drawing Sheets

(51) Int. Cl.
    *G06F 21/75*     (2013.01)
    *G01R 31/3177*     (2006.01)

(52) U.S. Cl.
    CPC ........ *G06F 11/079* (2013.01); *G06F 11/0751* (2013.01); *G06F 17/5068* (2013.01); *G06F 21/75* (2013.01)

(58) Field of Classification Search
    USPC .......................................................... 716/122
    See application file for complete search history.

(56) References Cited

U.S. PATENT DOCUMENTS

| | | | |
|---|---|---|---|
| 8,111,089 B2 | 2/2012 | Cocchi et al. | |
| 8,151,235 B2 | 4/2012 | Chow et al. | |
| 8,258,583 B1 | 9/2012 | Chow et al. | |
| 9,479,176 B1* | 10/2016 | Eble, III | H03K 19/17768 |
| 2002/0096776 A1 | 7/2002 | Chow et al. | |
| 2003/0122138 A1* | 7/2003 | Kash | G01R 31/311 257/80 |
| 2004/0099912 A1* | 5/2004 | Chow | H01L 23/573 257/368 |
| 2006/0109117 A1* | 5/2006 | Hsu | G06F 21/554 340/571 |
| 2007/0243675 A1* | 10/2007 | Chow | H01L 23/573 438/183 |
| 2008/0040593 A1* | 2/2008 | Kaabouch | G06F 21/52 712/244 |
| 2008/0061980 A1* | 3/2008 | Kean | G06F 21/76 340/572.1 |
| 2008/0282208 A1* | 11/2008 | Anderson | G06F 21/75 716/136 |
| 2010/0213974 A1* | 8/2010 | Chow | G06F 17/5068 326/38 |
| 2010/0301903 A1* | 12/2010 | Cocchi | H03K 19/20 326/122 |
| 2012/0139582 A1* | 6/2012 | Cocchi | G06F 17/5068 326/41 |
| 2015/0071434 A1* | 3/2015 | Thacker, III | G03G 15/0863 380/30 |
| 2015/0381351 A1* | 12/2015 | Kuenemund | H04L 9/0618 713/189 |
| 2016/0034694 A1* | 2/2016 | Rajendran | G09C 1/00 713/190 |
| 2017/0091368 A1* | 3/2017 | Wang | G06F 17/5072 |
| 2017/0141930 A1* | 5/2017 | Rajski | H04L 9/3278 |
| 2017/0359071 A1* | 12/2017 | Cocchi | G06F 17/5045 |

OTHER PUBLICATIONS

Written Opinion for International Application No. PCT/US2014/054911 dated Dec. 18, 2014.
"International Technology Roadmap for Semiconductors." http://www.itrs.net/Links/2011ITRS/Home2011.htm.
Roy, Jarrod A. et al., "EPIC: Ending Piracy of Integrated Circuits," Proceedings of the IEEE/ACM Design, Automation and Test in Europe, pp. 1069-1074, 2008.
Chakraborty, Rajat Subhra et al., "HARPOON: An Obfuscation-Based SoC Design Methodology for Hardware Protection," IEEE Transaction on Computer-Aided Design of Integrated Circuits and Systems, vol. 28, No. 10, pp. 1493-1502, Oct. 2009.
"Innovation is at risk as Esemiconductor Equipment and Materials Industry Loses up to $4 billion annually due to IP infringement." www.semi.org/en/Press/P043775, 2008.
Torrance, Randy et al., "The State-of-the-Art in Semiconductor Reverse Engineering," Proc. of IEEE/ACM Design Automation Conference, pp. 333-338, 2011.
ExtremeTech, "iPhone 5 A6 SoC reverse engineered, reveals rare hand-made custom CPU, and tri-core GPU." http://www.extremetech.com/computing/136749-iphone-5-a6-soc-reverse-engineered-reveals-rare-hand-made-custom-cpu-and-a-tri-core-gpu.
Silicon Zoo, "The Layman's Guide to IC Reverse Engineering." http://siliconzoo.org/tutorial.html.
Degate, http://www.degate.org/documentation/.
SypherMedia, "Syphermedia Library Circuit Camouflage Technology." http://www.smi.tv/solutions.htm.
Torrance, Randy et al., "The State-of-the-Art in Reverse Engineering (RE101)," Chipworks, Inside Technology, pp. 1-33, May 21, 2008.
Hansen, Mark C. et al. "Unveiling the ISCAS-85 benchmarks: A case study in reverse engineering," IEEE Design Test of Computers, vol. 16, No. 3, pp. 72-80, 1999.
Li, Wenchao et al, "Reverse Engineering Circuits using Behavioral Pattern Mining," In the Proc. of IEEE International Symposium on Hardware-Oriented Security and Trust, pp. 83-88, 2012.
Subramanyan, Pramod et al. "Reverse Engineering Digital Circuits using Functional Analysis," In the Proc. of IEEE/ACM Design Automation and Test in Europe, pp. 1277-1280, 2013.
Bushnell, Michael L. et al, "Essentials of Electronic Testing for Digital, Memory, and Mixed-Signal VLSI Circuits," Kluwer Academic Publishers, Boston, pp. 1-713, 2000.
Kahng, A.B. et al.,"Watermarking techniques for intellectual property protection," In the Proc. of IEEE/ACM Design Automation Conference, pp. 776-781, 1998.
Koushanfar, Farinaz et al., "Behavioral Synthesis Techniques for Intellectual Property Protection," ACM Transactions on Design Automation of Electronic Systems, vol. 10, No. 3, pp. 523-545, 2005.
Kahng, Andrew B. et al., "Robust IP Watermarking Methodologies for Physical Design," In the Proc. of Design Automation Conference, pp. 782-787, 1998.
Alkabani, Yousra M. et al., "Active Hardware Metering for Intellectual Property Protection and Security," Proceedings of USENIX Security, pp. 291-306, 2007.
Suh, G. Edward et al., "Physical Unclonable Functions for Device Authentication and Secret Key Generation," Proceedings of the IEEE/ACM Design Automation Conference, pp. 9-14, 2007.
Lee, Jae W. et al., "A technique to build a secret key in integrated circuits for identification and Authentication Applications," In the Proc. of IEEE International Symposium on VLSI Circuits, pp. 176-179, 2004.
Intelligence Advanced Research Projects Activity, "Trusted Integrated Circuits Program." https://www.fbo.gov/utils/view?id=b8be3d2c5d5babbdffc6975c370247a6.
DIGITIMES Research, "Trends in the global IC design service market." http://www.digitimes.com/Reports/Report.asp?datepublish=2012/3/13\&pages=RS\&seq=400\&read=toc.
Chipworks, "Intel's 22-nm Tri-gate Transistors Exposed." http://www.chipworks.com/blog/technologyblog/2012/04/23/intels-22-nm-tri-gate-transistors-exposed/, 2012.
Torrance, R. et al., "The State-of-the-Art in IC Reverse Engineering," In the Proc. of Cryptographic Hardware and Embedded Systems, pp. 363-381, 2009.

* cited by examiner

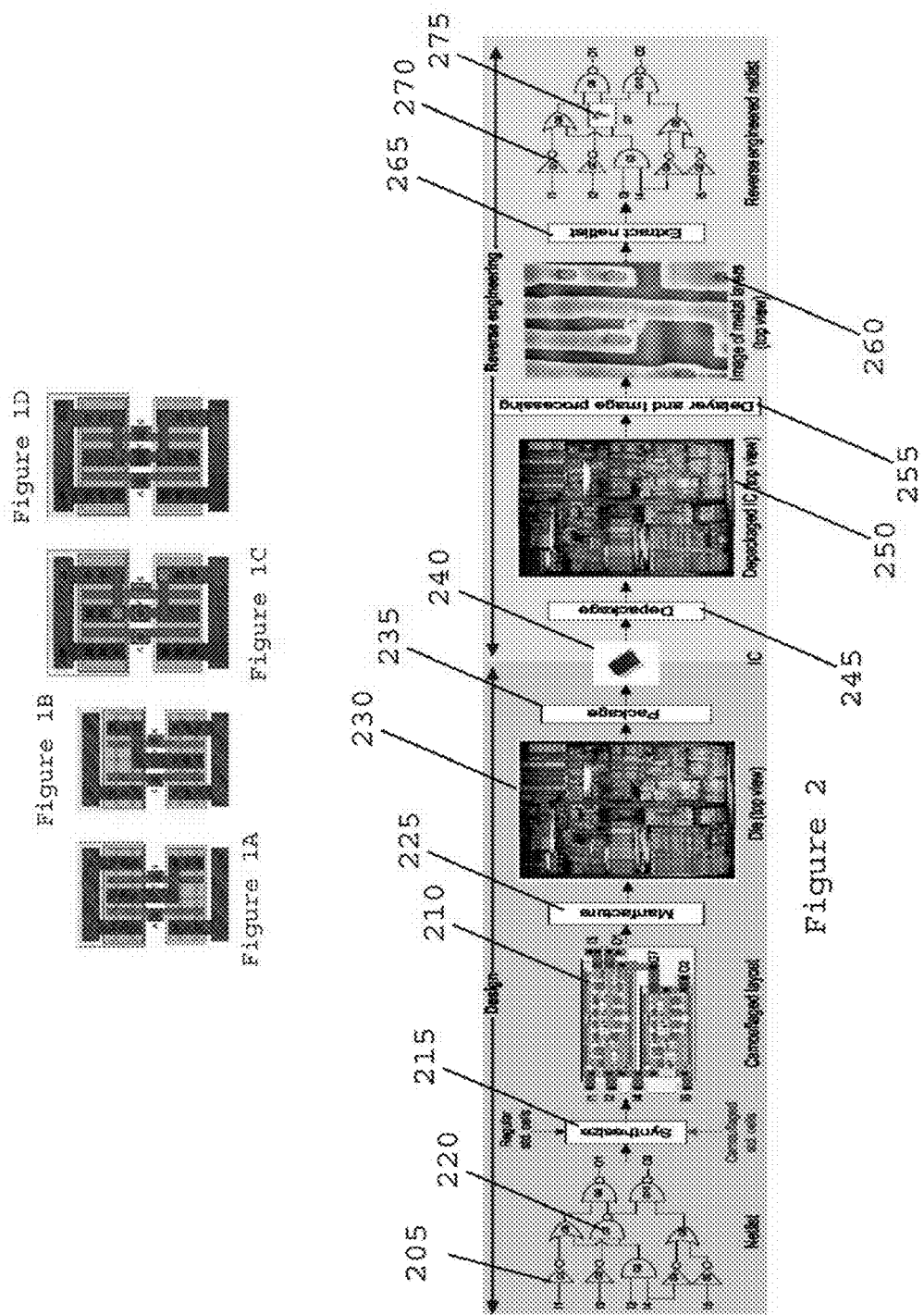

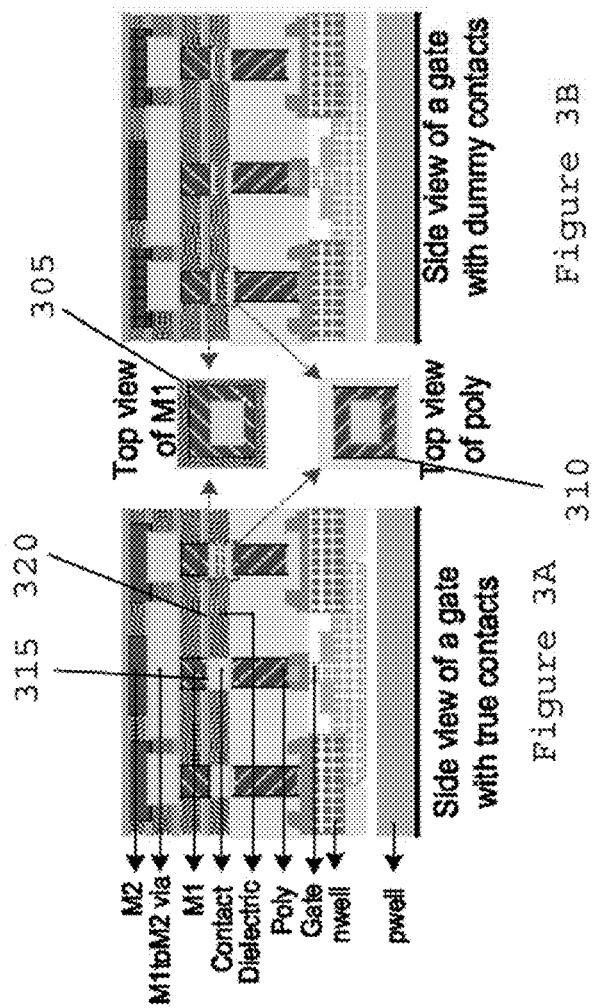
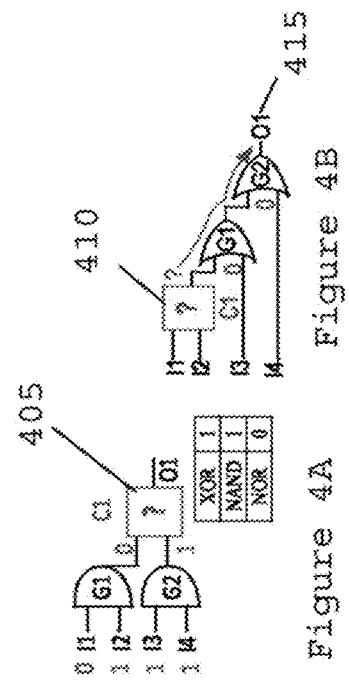

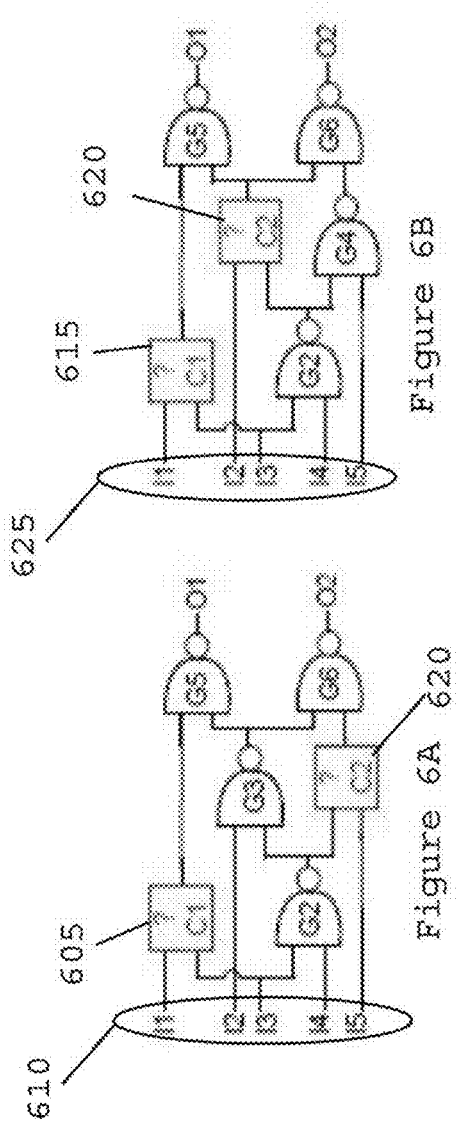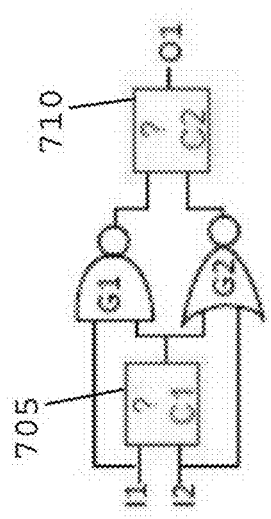

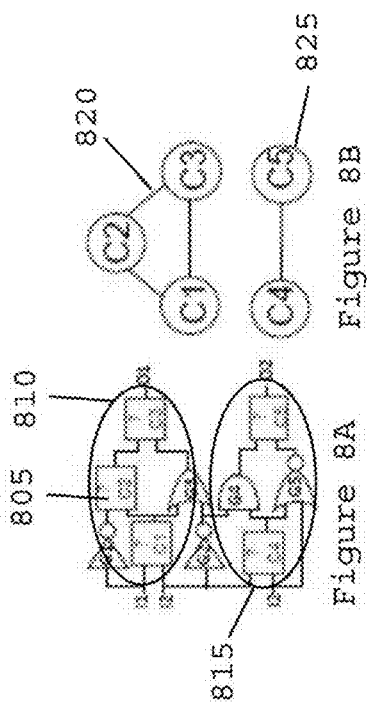
Figure 8A
Figure 8B
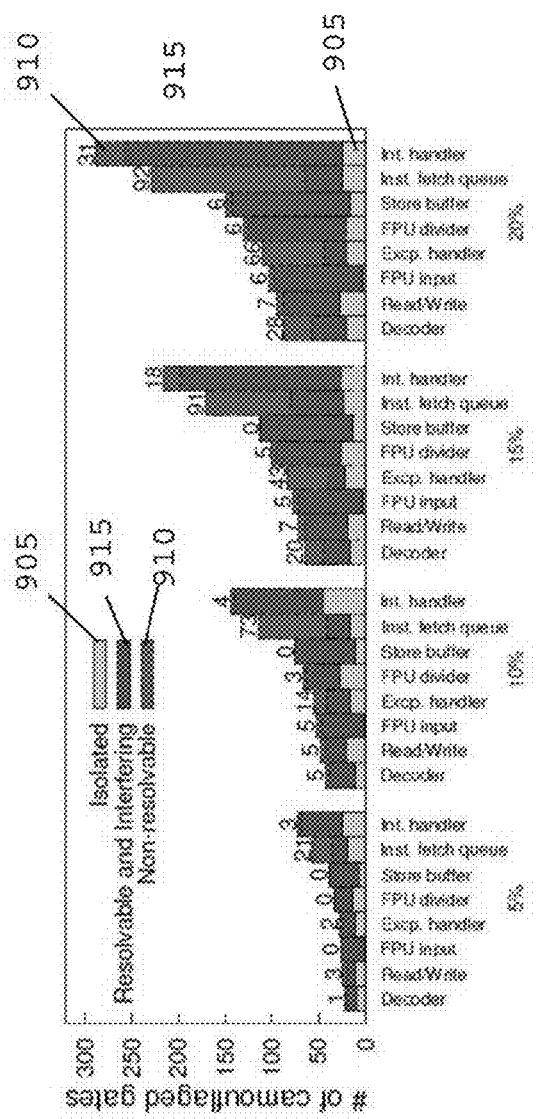
Figure 9 ns filed on Sep. 10, 2014, which relates to U.S.
SYSTEM, METHOD AND COMPUTER-ACCESSIBLE MEDIUM FOR FAULT ANALYSIS DRIVEN SELECTION OF LOGIC GATES TO BE CAMOUFLAGED

CROSS-REFERENCE TO RELATED APPLICATIONS

This application relates to and claims the benefit and priority from International Patent Application No. PCT/US2014/054911 filed on Sep. 10, 2014, which relates to U.S. Patent Application No. 61/876,298, filed on Sep. 11, 2013, the entire disclosures of which are incorporated herein by reference.

FIELD OF THE DISCLOSURE

The present disclosure relates generally to very large scale integration ("VLSI") manufacturing, and more specifically, to exemplary embodiments of systems, methods and computer-accessible mediums that can utilize fault analysis for selecting the gates to be camouflaged in the layout of an integrated circuit.

BACKGROUND INFORMATION

Integration of digital, analog, radio frequency, photonic and other devices into a complex System-on-Chip ("SOC") has been previously demonstrated. (See, e.g., Reference 1). Recently, for example, sensors, actuators and biochips are also being integrated, into these already powerful SOCs. SOC integration has been enabled by advances in mixed system integration and the increase in the wafer sizes (e.g., currently about 300 mm and projected to be 450 mm by 2018) (see, e.g., Reference 1), and it has also reduced the cost per chip of such SOCs. However, support for multiple capabilities, and mixed technologies, have increased the cost of owning an advanced foundry. For instance, the cost of owning a foundry will be approximately $5 billion in 2015. (See, e.g., Reference 2). Consequently, only advanced commercial foundries can now manufacture such high performance, mixed system, SOCs especially at the advanced technology nodes. (See, e.g., Reference 3). Absent the economies of scale, many of the design companies cannot afford to own and/or acquire expensive foundries, and have to outsource their fabrication process to one-stop-shop foundries.

While the globalization of Integrated Circuits ("IC") design flow has successfully ameliorated the design complexity and fabrication cost problems, it has led to several security vulnerabilities. If a design is fabricated in a foundry that may not be under the direct control of the fabless design house, attacks, such as reverse engineering, malicious circuit modification and Intellectual Property ("IP") piracy can be possible. (See, e.g., Reference 3). For example, an attacker, anywhere in this design flow, can reverse engineer the functionality of an IC/IP, and then steal and claim ownership of the IP. An untrusted IC foundry can overbuild ICs and sell them illegally. Further, rogue elements in the foundry can insert malicious circuits (e.g., hardware Trojans) into the design without the designer's knowledge. (See, e.g., References 4 and 5). Because of these attacks and issues, the semiconductor industry loses tens of billions of dollars annually (see, e.g., Reference 6). This can also be because the designers have minimum control over their IP in this distributed design and fabrication flow.

While hardware security and trust is a relatively recent concern, a somewhat similar, yet fundamentally different problem of manufacturing defects has been on the research agenda of VLSI test researchers for the last few decades. The attacks detailed above are man-made, intentional, and meant to be hidden, while manufacturing defects can be more natural and unintentional, hampering the use of existing defect testing techniques. However, many concepts in VLSI testing, such as, for example, justification and sensitization, can be adapted for application in the context of hardware security and trust. Inspired by the design enhancement approach (e.g., Design-for-Testability ("DfT")) for better testability of manufacturing defects, strong Design-for-Trust ("DfTr") solutions can be devised against these attacks, detecting and possibly preventing them.

IC reverse engineering techniques can be broadly classified into two types: extraction of gate-level netlist from layout, and extraction of functional specification from gate-level netlist. Reverse engineering of an IC to extract a gate-level netlist has been proposed. (See, e.g., References 8 and 14). Procedures to extract a gate-level netlist from transistors have also been suggested. (See, e.g., Reference 15).

For example, the DARPA IRIS program seeks to obtain the functional specification of a design by reverse engineering its gate-level netlist. Previous techniques can exploit structural isomorphism to extract the functionality of datapath units. (See, e.g., Reference 16). Other techniques have been used to reverse engineer the functionality of unknown units by performing behavioral matching against a library of components with known functionalities such as adders, counters, register files and subtracters. (See, e.g., Reference 17). Still other techniques have identified the functionality of unknown modules by performing a Boolean satisfiability analysis with a library of components with known functionalities. (See, e.g., Reference 18).

Thus, it may be beneficial to provide an exemplary DfTr IC camouflaging technique, system, arrangement, computer accessible medium and method that can utilize fault activation, sensitization and masking, and which can overcome at least some of the deficiencies described herein above.

SUMMARY OF EXEMPLARY EMBODIMENTS

Exemplary systems, methods and computer-accessible mediums can be provided that can, for example, determine a camouflaging location(s) of the logic gate(s) using a fault analysis procedure, and can camouflage the logic gate(s) at the location(s) based on the determination. The camouflaging procedure can be performed by replacing the logic gate(s) at the camouflaging location(s) with a further camouflaged gate, which can have a dummy contact(s) or a vias. The camouflaged gate(s) can be configured to corrupt a functionality of the integrated circuit(s) after being incorrectly reverse engineered as a logic gate type that can be different from the logic gate(s). The number of the corrupted outputs can be about 50% of a total number of the outputs. A fault analysis procedure can be used to model an incorrect reverse engineering configuration, and utilize a fault simulation procedure to determine an effect of the incorrect reverse engineering configuration on an output(s) of the integrated circuit(s).

In some exemplary embodiments of the present disclosure, a plurality of camouflaging locations can be evaluated using a fault simulation procedure, at least some of which can be selected for camouflaging gates. The selection of the camouflaging location(s) can be performed using a Hamming Distance or Avalanche Criterion goals. The camouflaging procedure can be performed using an interference graph(s). The interference graph(s) can be generated based at least in part on an effect of the camouflaging location(s) on a further camouflaging location(s) of the integrated circuit(s). The interference graph(s) can include (i) a node(s) related to the camouflaging location(s), and (ii) an edge(s) that can be based on a degree of erasability of an effect of the camouflaging location(s) in or on the further camouflaging location(s). The camouflaging location(s) can be determined based on a clique analysis procedure on the interference graph. A clique(s) of the clique analysis procedure can be sized to enhance an encryption of the integrated circuit(s).

In some exemplary embodiments of the present disclosure, the camouflaging procedure can be performed using an interference graph(s). The camouflaging location(s) can be determined based on a clique analysis procedure performed on the interference graph. A camouflaging of the integrated circuit(s) can be enhanced using a substantially maximally-sized clique(s) of the clique analysis procedure. Each of the clique(s) can represent a set of non-resolvable and interfering camouflaged gates in a netlist. The interference graph(s) can include (i) a node(s) related to the camouflaging location(s), and (ii) a graph edge(s) that can be based on a degree of erasability of an effect of the camouflaging location(c) in or on a further camouflaging location(s).

In certain exemplary embodiments of the present disclosure, the node(s) can represent a non-resolvable and interfering camouflaged gate. The node(s) can be two nodes, and the nodes can be connected by that graph edge(s) if the corresponding non-resolvable and interfering camouflaged gates protect each other. The interference graph(s) can be generated based at least in part on an effect of the plurality of camouflaging locations on a further camouflaging location(s) of the integrated circuit(s). The interference can be determined based on a first camouflaging location of a first logic gate of the two or more logic gates blocking a further camouflaging location of a further logic gate of the two or more logic gates. The interference can be based on a first output of a first logic gate of the two or more logic gates at a first camouflaging location and a second output of a second logic gate of the two or more logic gates at a second camouflaging location converging at a further camouflaging location of a further logic gate of the two or more logic gates. The integrated circuit(s) can be watermarked.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIGS. 1A-1D are exemplary diagrams of exemplary cell layouts according to an exemplary embodiment of the present disclosure;

FIG. 2 is an exemplary diagram of how an exemplary design can be synthesized into a layout according to an exemplary embodiment of the present disclosure;

FIGS. 3A and 3B are exemplary diagrams of logic gates according to an exemplary embodiment of the present disclosure;

FIGS. 4A and 4B are exemplary schematics of camouflaged C1 gates according to an exemplary embodiment of the present disclosure;

FIGS. 6A and 6B are exemplary schematics of C1 and C2 gates according to an exemplary embodiment of the present disclosure;

FIG. 7 is an exemplary schematic of the functionality of C1 and C2 gates according to an exemplary embodiment of the present disclosure;

FIG. 8A is an exemplary schematic of a camouflaged C1 gate according to an exemplary embodiment of the present disclosure;

FIG. 8B is an exemplary interference graph according to an exemplary embodiment of the present disclosure;

FIG. 9 is an exemplary graph of various types of camouflaged gates according to an exemplary embodiment of the present disclosure;

Figure 5:
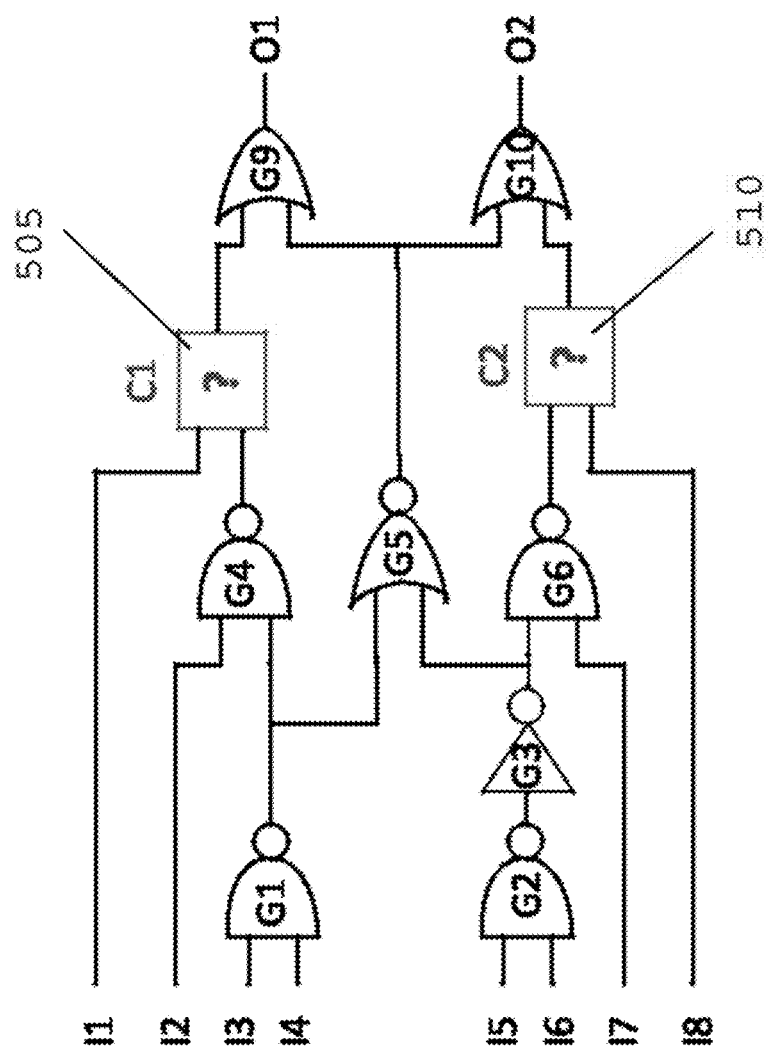
FIG. 5 is an exemplary schematic of C1 and C2 camouflaged gates according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures or in the appended claims.

DETAILED DESCRIPTION OF EXEMPLARY EMBODIMENTS

Exemplary Reverse Engineering Attack

Reverse engineering of an IC can be a process of identifying its structure, design and functionality. Traditionally, reverse engineering of IC's has been performed to collect competitive intelligence, to verify a design, to check for commercial piracy and for patent infringement.

Such exemplary reverse engineering procedure of ICs can:

1. Identify the device technology used in the IC. For instance, it was identified that Intel's Xeon processors use tri-gate transistors. (See, e.g., Reference 7).
2. Extract the gate-level netlist of the design. The gate-level netlist of a baseband processor from Texas Instruments was previously extracted. (See, e.g., Reference 8).
3. Infer the functionality. Reverse engineering on Apple's processor (see, e.g., Reference 9) revealed the type of graphic processing units used in the iPhone 5.

Several techniques and tools have been developed to enable reverse engineering of an IC. Tutorials and software products can be provided for reverse engineering. (See, e.g., References 11 and 12). Unfortunately, shrinking device dimensions has not hampered reverse engineering. For example, Intel's 22 nm Xeon processor has been successfully reverse engineered. (See, e.g., Reference 7).

While reverse engineering can serve certain benefits, an attacker can misuse it to steal and/or pirate a design. It can be possible to use the readily available tools and techniques for reverse engineering. By identifying a device technology, it can be possible to fabricate similar devices. It can then be possible to extract a gate-level netlist, and use it to design a similar IC, or illegally sell it as one's own IP. Further, it can be possible to use the components extracted from competitor's products. In this way, it can be possible to reveal competitor's trade secrets. Because of these harmful effects, reverse engineering was listed as one of the serious threats to semiconductor industry. (See, e.g., Reference 6).

Exemplary Threat Model

ICs reverse engineering can involve the following steps. (See, e.g., Reference 8):

1. Depackaging the IC using corrosive chemicals.
2. Delayering individual layers (e.g., metal, poly or diffusion) using corrosive chemicals.
3. Imaging the top-view of each layer using an optical microscope or single electron microscope ("SEM"). The image can contain metal routing, contacts, vias and pins in that layer.
4. Alignment and stitching the images of different layers using annotation.
5. Extraction of gate-level netlist from the annotated images. Various tools can be used for this purpose. (See, e.g., References 11 and 12).

A reverse engineer can face the following difficulties while reverse engineering the ICs.

Difficulty 1:

Delayering the lower metal layers (e.g., M1 and M2) can be difficult as compared to delayering higher metal layers (e.g., M3 and above), because lower metal layers may only be a few tens of nanometers thick. Thus, a reverse engineer has to precisely control the strength of the chemicals used for delayering. Notwithstanding this difficulty, reverse engineers have successfully extracted information from the lower metal layers. (See, e.g., Reference 8).

Difficulty 2:

An attacker cannot partially etch away a layer because when the chemicals can be applied on a layer, they can diffuse evenly in all directions.

Given the reverse engineering steps and practical limitations, the following threat model can define the attacker's capabilities:

1. It can be possible to have tools to reverse engineer an IC, which can include a setup to delayer an IC, an optical microscope or SEM to image the layers, and an image processing software tool. (See, e.g., References 11 and 12).
2. It can be possible to differentiate between a camouflaged standard cell and a regular standard cell from the images of different layers. This can be possible because the images of regular and camouflaged standard cells can be publicly available. (See, e.g., Reference 13.
3. It can be possible to know the list of functions that a camouflaged cell can implement.

Detecting IP piracy by verifying competitor's IC generally needs that IP owners have access to that competitor's IC. Such a passive approach can be bound to fail as potential adversaries can be anywhere across the globe. Proactive solutions that prevent, rather than detect, reverse engineering can be preferable. For example, previous known techniques can provide IC camouflaging services for this purpose. (See, e.g., Reference 13).

Exemplary IC Camouflaging to Thwart Reverse Engineering

A camouflaging procedure is a layout-level technique that can hamper an attacker from extracting a gate-level netlist of a circuit. The layouts of logic gates can be designed to look identical, resulting in an incorrect extraction. For example, as shown in FIGS. 1A and 1B, the layout of regular NAND and NOR cells can look different, and can be easy to reverse engineer. However, as shown in FIGS. 1C and 1D, the layout of camouflaged NAND and NOR cells can look identical, and can be difficult to differentiate. (See, e.g., References 13, 19, 20 and 21). Being deceived into interpreting the functionality of the camouflaged gate incorrectly, the attacker can obtain a reverse engineered netlist that can be different from the original. The netlist obtained by an attacker can be called the deceiving netlist where the functionality of camouflaged gates can be arbitrarily assigned.

FIG. 2 shows an exemplary diagram of how an exemplary design 205 can be synthesized into an exemplary layout 210 according to an exemplary embodiment of the present disclosure, which indicates how camouflaging can protect an IC design against reverse engineering. A designer can camouflage certain gates in the design (e.g., procedure 215). For example, the OR gate G7 (e.g., OR gate 220), shown in FIG. 2 can be camouflaged as camouflaged layout 210. This exemplary design with camouflaged gates can then be manufactured at a foundry (e.g., procedure 225), as die 230. The manufactured IC can be packaged (e.g., procedure 235) and sold in the market as chip 240.

An attacker can reverse engineer an exemplary IC by depackaging the IC (e.g., procedure 245) as depackaged IC 250, delayering the IC (e.g., procedure 255), imaging the layers (e.g., procedure 260), and extracting the netlist (e.g., procedure 265). However, in the extracted netlist (e.g., reverse engineered netlist 270), the functionality of the camouflaged gates can be unknown. For example, as shown in FIG. 2, the functionality of G7 (e.g., element 275) can be unknown and an attacker can assign an arbitrary two-input function to it. Consequently, an attacker can obtain an incorrect netlist.

The reverse engineer's inability to partially etch a layer can be used in a camouflaging technique based on dummy contacts. (See, e.g., Reference 21). Contacts are conducting materials that can connect two adjacent metal layers or a metal layer 1 and a poly-layer. They can pass through the dielectric that can separate the two connecting layers. While a conventional contact (e.g., true contact) has no gap, a dummy contact has a gap in the middle and can fake a connection between the layers.

FIGS. 3A and 3B illustrate exemplary diagrams of logic gates with different layers of the logic gate with true and dummy contacts between M1 305 and poly 310. A true contact 315 (e.g., see FIG. 3A) can span the entire dielectric 320, and can represent an electrical connection. However, in a dummy contact (e.g., see FIG. 3B), there may be no electrical connection because of the gap in the contact. From a reverse engineer's perspective, both the real and dummy contacts appear identical under a microscope. Consequently, the attacker cannot differentiate between them from the top view.

An IC camouflaging technique/procedure can also leverage unused spaces in a chip, and fill them with standard cells. (See, e.g., Reference 22). The outputs of these filler cells may not drive any active logic. Therefore, an attacker can identify and discard them while extracting the netlist. It can also be possible to camouflage a design by using programmable standard cells. (See, e.g., Reference 20). Post-fabrication, these cells can be programmed using a control input. However, such control inputs have to be stored on the chip, which need a tamper-proof non-volatile memory. Similar to introducing dummy contacts, a designer can also create dummy channels, which can result in non-functional transistors. (See, e.g., Reference 23). Such exemplary non-functional transistors can be used to deceive an attacker.

Exemplary Criteria for IC Camouflaging

The exemplary IC camouflaging technique/procedure can satisfy two criteria: (a) wrong outputs can be produced on attempts to try the wrong one of many possible functionalities of a camouflaged gate, and (b) an attacker should not be able to retrieve functionality of the camouflaged gates.

Exemplary Criterion 1—Output Corruption:

An exemplary objective of the defender (e.g., designer) can be to prevent his/her IP from being copied by an attacker in the foundry, and to prevent black-box usage of the IP. The attacker does not know the functionality of the camouflaged gates. Therefore, he/she can try to use one of the many possible functionalities of each camouflaged gate, and expect the design to become functional (e.g., to produce correct outputs). In the worst case, he/she has to perform a brute force attack by trying out all possible functionalities of all camouflaged gates. The objective of the defender can be to force the attacker to perform a brute force attack. Therefore, the defender may have need to use the camouflage design to produce wrong outputs on the wrong functionality assignment to camouflaged gates. A defender has to camouflage the design such that an attacker, with the knowledge of the publicly available IC camouflaging objectives and procedures, may not be able to obtain the correct outputs by trying a wrong functionality. This can be done by minimizing the correlation between the corrupted and the original outputs, and thus, by maximizing the ambiguity for the attacker. The optimal point can be where 50% of the outputs can be corrupted upon trying a wrong functionality.

Exemplary Criterion 2—Difficult-to-Break Camouflaging:

An attacker can possibly exercise a working chip (e.g., with the exemplary IC camouflaging technique/procedure) through well-crafted input patterns in order to identify the functionality of the camouflaged gates by analyzing functional outputs of the chip. A strong camouflaging technique/procedure can withstand such functionality-identification attacks.

Exemplary Test Principles

Well-known VLSI test principles (see, e.g., Reference 24) can be leveraged to develop a strong DfTr technique. Exemplary VLSI test principles that can be considered can include:

Exemplary Test Principle 1—Fault Excitation:

A stuck-at-v fault at a site can be excited when an input pattern justifies that site to v'.

Exemplary Test Principle 2—Sensitization:

A site can be sensitized to an output if every side input of every gate on a path from the site to the output can be justified to the non-controlling value of the gate. Sensitization of an internal line l to an output O can refer to the condition (e.g., values applied from the primary inputs to justify the side input of gates on the path from l to O to the non-controllable values of the gates) which can bijectively map l to O, and thus, can render any change on l observable on O.

Exemplary Test Principle 3—Fault Propagation:

The effect of a fault at a site propagates to an output if the input pattern excites the fault, and sensitizes the faulty site to the output.

Exemplary Test Principle 4—Fault Masking:

Multiple effects of the same excited fault or multiple excited faults can mask each other when none of their effects manifest at the outputs, as the errors cancel out.

These principles can be utilized in order to:
a) Control the corruption at the outputs. Gates to be camouflaged can be selected in IC camouflaging judiciously in order to control the level of output corruption. This can utilize the modeling of the injected corruption (e.g., corresponding to the ambiguity of camouflaged gates) as faults, and making the DfTr decisions so as to favor the activation and propagation of these 'faults'.
b) Make sure that the DfTr technique can be difficult-to-break. In IC camouflaging, the ambiguity regarding the one-of-many functionalities of camouflaged gates in the reverse engineered netlist needs to be maintained. This can utilize the prevention of divide-and-conquer approaches by an attacker where he/she can target camouflaged gates individually or in small groups.

The use of these exemplary test principles in improving the basic IC camouflaging technique is illustrated below.

Exemplary Enhanced Camouflaging with Built-in Fault Analysis Engine

Exemplary Fault Analysis Driven IC Camouflaging

The exemplary IC camouflaging techniques/procedures can be performed by carefully selecting the logic gates to be camouflaged with the ultimate goal of meeting the output corruption and the difficult-to-break camouflaging criteria. The following observations can relate IC camouflaging and fault analysis in IC testing, and can be leveraged to guide the selection of gates to camouflage for this purpose.

Exemplary Connection to Test Principle 1:

Attempting the wrong functionality of a camouflaged gate can be analogous to excitation of a fault. For the wrong functionality, either a stuck-at-0 (e.g., s-a-0) or stuck-at-1 (e.g., s-a-1) fault can get excited. This is illustrated in FIG. 4A for camouflaged gate C1 (e.g., element 405) that could implement one of many functionalities of XOR, NAND or NORs. The exemplary pattern can justify the inputs of C1 to '01'. If the actual functionality of C1 can be XOR/NAND and the attempted functionality can be NOR (e.g., by the reverse engineer), an error can be introduced. The same error can be introduced when a stuck-at-0 at the output of C1 can be excited. However, if the actual functionality can be XOR and the attempted functionality can be NAND, this pattern can fail to introduce any corruption. A different pattern can be needed in that case.

Exemplary Connection to Test Principle 3:

Corruption of an output due to attempting a wrong functionality of a camouflaged gate can be analogous to the propagation of an excited fault. This is illustrated for the exemplary circuit shown in FIG. 4B, where the corruption can be propagated from the output of C1 (e.g., element 401) to O1 (e.g., element 415).

Exemplary Meeting of Criterion 1:

Gates can be selected to be camouflaged such that attempting wrong functionalities can affect 50% of the outputs. In terms of fault simulation, this exemplary goal can be stated as finding a set of faults, which together can affect 50% of the outputs when excited.

Exemplary Threat Model: Utilizing Test Principles to Reverse Engineer Camouflaged Gates One of the objectives of a reverse engineer can be to determine the function implemented by every camouflaged gate. To reverse engineer a camouflaged IC, it can be possible to perform the following steps.

1. Buy two copies of the target chip from the market.
2. Extract the netlist with camouflaged gates from the first chip via basic reverse engineering techniques.
3. Compute specialized input patterns by using test principles.
4. Apply these patterns on the second chip and obtains the outputs.
5. Resolve the functionality of camouflaged gates.

One of the exemplary steps above can be to generate the input patterns that help resolve the functionality of the camouflaged gates. One of the exemplary goals can be to construct the truth table of a camouflaged gate in order to reveal its functionality. The attacker has to justify the inputs of the camouflaged gate to the functionality-differentiating values, and observe the output of the gate at a primary output. The functionality-differentiating input combination at the camouflaged gate inputs can be determined by the multiple possible functionalities that the camouflaged gate could possibly implement. If the camouflaged gate could implement either NAND or NOR, either one of the '01' or '10' input combinations can help identify the actual functionality.

Exemplary Connection to Test Principle 2:

Determining the functionality of a camouflaged gate can be analogous to justifying the gate inputs to the functionality-differentiating values, and sensitizing gate output to an output without being masked/blocked by the other camouflaged gates. By observing the output, the response of the camouflaged gate to the functionality-differentiating input combination can be determined, given that other camouflaged gates may not interfere with the sensitized path. This is illustrated in FIG. 5, which shows an exemplary schematic of C1 (e.g., element 505) and C2 (e.g., element 510) camouflaged gates according to an exemplary embodiment of the present disclosure.

Exemplary Types of Camouflaged Gates

The functionality of an exemplary camouflaged gate can be unambiguously resolved based on its location in the circuit. An isolated camouflaged gate does not have any circuit paths that interfere with other camouflaged gates. For example, FIG. 6A shows a schematic of the camouflaged gate C1 (e.g., element 605) according to an exemplary embodiment of the present disclosure. The exemplary functionality of C1 can be resolved by applying '001XX' at the primary inputs 610. This input pattern can justify the inputs of C1 to '01' and can sensitize the output of C1 to O1. If O1 can be '0', then the functionality of C1 can be resolved as NAND. Otherwise, the functionality of C1 can be resolved as NOR.

While reverse engineering an isolated camouflaged gate can be easy, the process can become complicated when the camouflaged gates interfere with each other. This can be due to the difficulty justification and sensitization in the presence of multiple camouflaged gates.

For resolvable and interfering camouflage gates, two camouflaged gates, C1 and C2, can interfere when C2 can lie on a path between C1 and an output, and/or C1 and C2 can converge at some other gate. To resolve the exemplary functionality of C1, it can be possible to find an input pattern that can (i) justify the output of C2 to a known value, (ii) justify the inputs of C1 to a desired input combination, and (iii) sensitize the output of C1 output to a primary output.

FIG. 6B shows exemplary schematics of camouflaged gates C1 (e.g., element 615) and C2 (e.g., element 620) according to an exemplary embodiment of the present disclosure. For example, C1 and C2 can be NAND or NOR. The exemplary functionality of C1 can be resolved by applying '0011X' at the inputs 625. This pattern can justify the output of C2 to '1' irrespective of whether it can be a NAND or NOR, and can justify the inputs of C1 to '01', and sensitize the output of C1 to O1. If O1 can be 0, then the functionality of C1 can be resolved as NAND. Otherwise, the functionality of C1 can be resolved as NOR. After resolving the functionality of C1, the functionality of C2 can be resolved.

For non-resolvable, and interfering camouflaged gates, while targeting a camouflaged gate, it may not always be possible to (i) generate an input pattern that can simultaneously justify the outputs of the other camouflaged gates to known values; (ii) justify the desired values to the input of the target camouflaged gate; and/or (iii) sensitize the output of the target camouflaged gate to a primary output. It may also not be possible to resolve the functionality of such non-resolvable and interfering camouflaged gates.

For example, consider the camouflaged gates, C1 (e.g., element 705) and C2 (e.g., element 710), shown in FIG. 7. If a person is trying to resolve C1, he/she cannot propagate C1's output to O1 without resolving C2. Thus, C1's functionality cannot be resolved. If one can be trying to resolve C2, one needs to justify the output of C2 to '1' or '0'. But, this would likely prevent justifying C2's input to either '10' or '01'. Consequently, it may not be possible to unambiguously resolve the functionality of C2 without resolving C1. Thus, C1 and C2 can mutually protect each other.

Exemplary Implementing Difficult-to-Break IC Camouflaging

The attacker should be forced into using brute force in his/her attempts to identify the functionality of the camouflaged gates. Thus, the gates to be camouflaged should be selected judiciously. Interference between the camouflaged gates can increase the brute force effort of the attacker, forcing him/her to target camouflaged gates in large groups rather than individually.

Exemplary Meeting Criterion 2:

The exemplary IC camouflaging technique/procedure can be strengthened by creating complex interferences amongst the camouflaged gates. By selecting the camouflaged gates such that they block each other's path, and/or they converge in some other gate, a difficult-to-break the exemplary IC camouflaging technique/procedure that forces the attacker into brute-force can be implemented, preventing linear complexity attacks that can target individual camouflaged gates and identify individual gate functionalities one at a time.

Using VLSI test principles of justification and sensitization, one can evaluate the strength of an IC camouflaging technique. Since an attacker can unambiguously resolve the functionality of isolated and resolvable and interfering camouflaged gates, these gates do not offer security. Only non-resolvable and interfering gates can offer ambiguity (e.g., NAND or NOR function) to an attacker, thereby forcing him/her to perform a brute force analysis to resolve the functionality of the gates. The amount of brute force used to resolve the functionality of non-resolvable and interfering camouflaged gates can determine the strength of IC camouflaging.

Ideally, if there can be N non-resolvable and interfering camouflaged gates, a reverse engineer has to brute force for $2^N$ functions. However, this may not always be guaranteed as explained in the following scenario. For example, FIG. 8A shows a circuit according to an exemplary embodiment of the present disclosure. This exemplary circuit can have five camouflaged gates (e.g., gates 805). Based on the interference between gates 805, these five camouflaged gates can be classified into two sets. The first set (e.g., set 810) can contain gates C1, C2 and C3, and the second set (e.g., set 815) can contain gates C4 and C5. The camouflaged gates within a set can mutually protect each other. The camouflaged gates in two different sets can be targeted independent of each other. The amount of brute force needed to resolve the functionality of the camouflaged gates in set 810 can be 8 (e.g., $=2^3$). The amount of brute force needed to resolve the functionality of the camouflaged gates in set 815 can be 4 (e.g., $=2^2$). The total amount of brute force used by a reverse engineer can be 8+4=12.

It is possible to observe that the amount of brute force can largely be determined by the number of camouflaged gates in the largest set of non-resolvable and interfering gates. Increasing the number of camouflaged gates in the largest set of non-resolvable and interfering gates can increase the effort for an attacker exponentially. However, increasing the number of camouflaged gates in the other sets of non-resolvable and interfering gates can increase the effort for an attacker linearly.

The strength of IC camouflaging (e.g., the amount of brute force needed by an attacker) can be determined using graph notation. An interference graph can be constructed for this purpose. In this exemplary graph, each non-resolvable and interfering camouflaged gate can be represented as a node. Two nodes can be connected by an edge if the corresponding non-resolvable and interfering camouflaged gates protect each other. Each clique in the graph can represent a set of non-resolvable and interfering camouflaged gates in the netlist. The size of the maximum clique in the interference graph can determine the strength of the IC camouflaging technique.

FIG. 8B illustrates the exemplary interference graph of FIG. 8A. For example, camouflaged gates C1, C2, and C3 can form one clique 820, and camouflaged gates C4 and C5 can form another clique 825 in the interference graph. The size of the largest clique can be 3, and the size of the other clique can be 2. The total number of brute force attempts needed to identify the functionality of the camouflaged gates can be $2^3+2^2=12$.

To generalize the effort for an attacker, consider an interference graph with M cliques. Each camouflaged gate can implement one out of K functions. Then, the number of brute force attempts needed to resolve the functionality of the camouflaged gates can be, for example, $\Sigma_{i=1}^{M} K^{\# \text{ of nodes in clique } i}$.

Camouflaged gates that can implement either a NAND or a NOR function may only be considered. Therefore, for an interference graph with M cliques, the amount of brute force attempts needed to resolve the functionality of the camouflaged gates can be, for example, $\Sigma_{i=1}^{M} 2^{\# \text{ of nodes in clique } i}$.

Exemplary techniques, such as watermarking and passive metering, have also been proposed to detect IC piracy. In an exemplary watermarking technique/procedure, a designer can embody his/her signature into the design. (See, e.g., Reference 25). During litigation, the designer can reveal the watermark, and claim ownership of an IC/IP. Watermarks can be constructed by adding additional states to the finite state machine of the design, adding secret constraints during high-level (see, e.g., Reference 26), logical, or physical synthesis. (See, e.g., Reference 27).

In exemplary passive metering techniques/procedures, a unique device ID for every IC can be created by leveraging process variations. (See, e.g., Reference 28). Physical unclonable functions can be leveraged to produce such IDs. (See, e.g., References 29 and 30). If a user pirates an IC, he/she can be caught if/when the device ID can be checked against a precompiled database of IDs.

Exemplary Camouflaging OpenSPARC TI Microprocessor
Exemplary Experimental Setup

Exemplary OpenSPARC TI microprocessor controllers can be camouflaged (see, e.g., Reference 11) using look-alike standard cells. The SPARC core has a six-stage pipeline that can execute four threads. Since the OpenSPARC's IP can be mostly realized as controllers, the controllers can be camouflaged.

The HOPE fault simulation tool can be used (see, e.g., Reference 12) to determine the input patterns for justification and sensitization to reverse engineer the functionality of a camouflaged gate, and to determine the type of a camouflaged gate. Camouflaged gates that can implement a NAND or a NOR function may only be considered. Two-input gates in a design were selected randomly, synthesized using either NAND and NOR standard cells, and camouflaged. 5%, 10%, 15%, and 20% of the total number of the gates in each controller were camouflaged. The area, power, and delay overheads were obtained using the Cadence RTL compiler. (See, e.g., Reference 13).

Exemplary Security of IC Camouflaging Using Look-Alike Camouflaged Cells

FIG. 9 is an exemplary graph showing an exemplary number of each type of camouflaged gates in different OpenSPARC controllers randomly camouflaging different percentages of gates, according to an exemplary embodiment of the present disclosure. Most of the gates can either be isolated 905 or resolvable 910, which can benefit the reverse engineer. For example, in all the controllers, except for the instruction fetch queue controller, only less than about 15% of the camouflaged gates can be of the non-resolvable type. Such camouflaged gates can use brute force analysis to determine their functionality.

As shown in FIG. 9, the maximum clique size values can be shown as numbers on top of the bars. When about 5% of the gates can be randomly selected and camouflaged, the maximum clique value can be zero for many design blocks. This can be because the camouflaged gates can mainly be isolated and resolvable. However, the number of non-resolvable and interfering camouflaged gates (e.g., element 915) can increase on camouflaging additional gates. Furthermore, this can also increase the size of the largest clique, thereby increasing the amount of brute force analysis exponentially.

Consider the case where 20% of the gates in the instruction fetch queue controller unit can be camouflaged; 228 gates in this unit can be camouflaged. Ideally, the maximum clique size for this unit should be 228 such that the attacker can brute force for $2^{228}$ functions. However, 25 camouflaged gates can be of the isolated type, and 39 camouflaged gates can be of the resolvable and interfering type. Only 164 camouflaged gates in this design can be of the non-resolvable and interfering type. Out of these 164 camouflaged gates, 92 of them can be in one clique, and the other 72 camouflaged gates can be in another clique. Thus, the size of the maximum clique can be 92. Thus, one can brute force for $2^{92}+2^{72}$ functions instead of $2^{228}$ functions.

Figure 10:
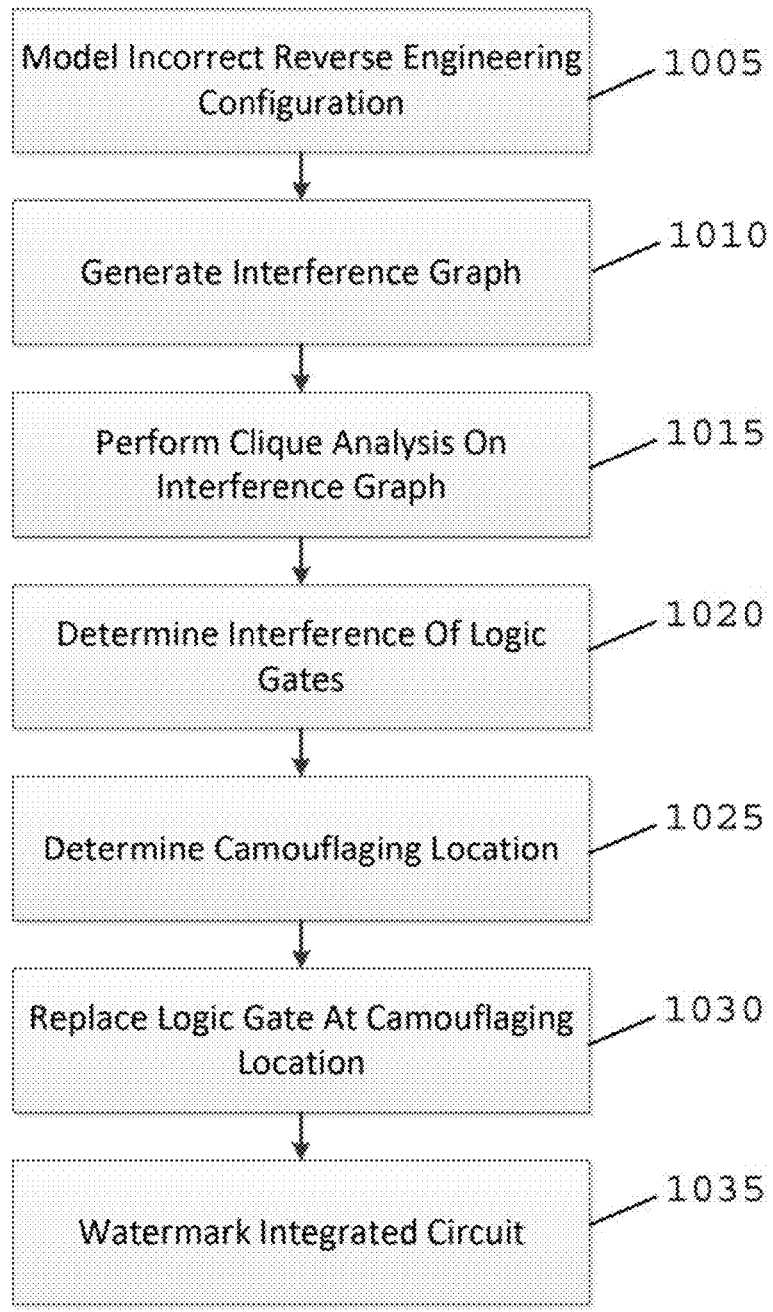
FIG. 10 is an exemplary flow diagram of an exemplary method for camouflaging a logic gate according to an exemplary embodiment of the present disclosure.

FIG. 10 is an exemplary flow chart of an exemplary method for camouflaging a logic gate of an IC according to an exemplary embodiment of the present disclosure Exemplary Power, Delay, and Area Overheads Table 1 below illustrates exemplary average power, delay, and area overheads of camouflaging. Even though the overhead can be high, at the system-level, this can be negligible, as these controllers can constitute less than 1% of the entire OpenSPARC processor. If a designer wants to control this overhead, the designer can pursue a power- and delayconstrained camouflaging. However, this can reduce the security offered by the IC camouflaging technique.

TABLE 1

Average power, delay and area overheads of IC camouflaging

| % of gates camouflaged | % overhead | | |
|---|---|---|---|
| | Power | Delay | Area |
| 5 | 27.4 | 15.7 | 3.1 |
| 10 | 52.7 | 19.3 | 6.1 |
| 15 | 80.8 | 17.6 | 9.16 |
| 20 | 104.3 | 20.8 | 12.0 |

EXEMPLARY CONCLUSIONS

To cope with increasing design complexity and unmanageable fabrication costs, IC design flow has evolved into a distributed one where designers can utilize third party IP cores, and outsource various steps in the flow, including fabrication, to third party companies. Security vulnerabilities have been emerging as a result, forcing IC designers and end-users to re-evaluate their trust in manufactured hardware. Security threats in the form of hardware Trojans, counterfeit ICs, IP piracy, IC overbuilding and reverse engineering deem hardware trust as yet another feature that the designers must consider.

The exemplary systems, methods and computer-accessible mediums according to exemplary embodiments of the present disclosure can utilize Design-for-Trust procedures called IC camouflaging, which can be strengthened. By defining/quantifying security metrics, and deciphering the relationship between the fundamentals of this DfTr technique and fault analysis rules, it can be shown that the exemplary systems, methods and computer-accessible mediums can enhance IC camouflaging through the use of built-in fault analysis engines.

Figure 11:
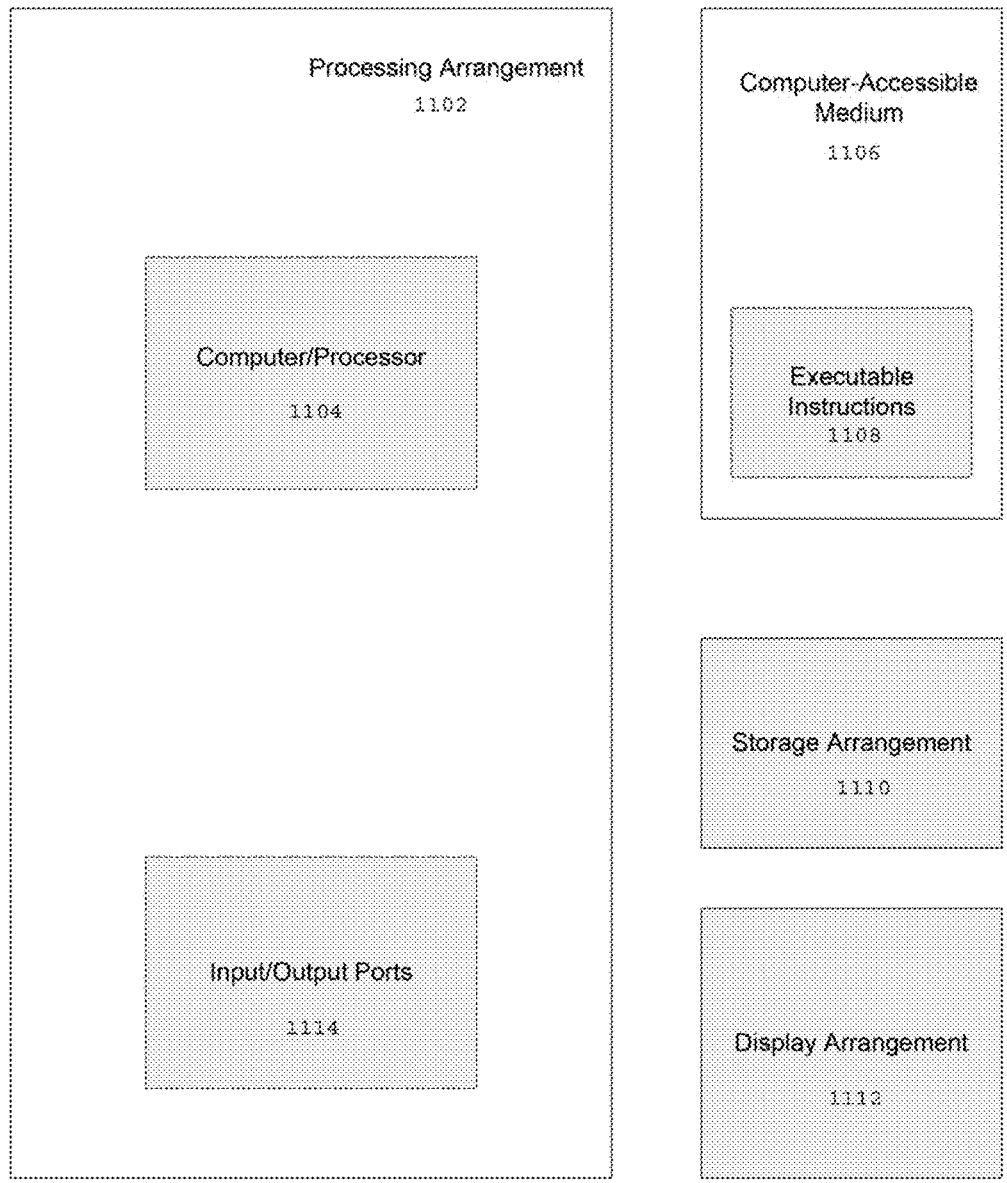
FIG. 11 is an illustration of an exemplary block diagram of an exemplary system in accordance with certain exemplary embodiments of the present disclosure.

FIG. 11 shows a block diagram of an exemplary embodiment of a system according to the present disclosure. For example, exemplary procedures in accordance with the present disclosure described herein can be performed by a processing arrangement and/or a computing arrangement 1102. Such processing/computing arrangement 1102 can be, for example, entirely or a part of, or include, but not limited to, a computer/processor 1104 that can include, for example, one or more microprocessors, and use instructions stored on a computer-accessible medium (e.g., RAM, ROM, hard drive, or other storage device).

As shown in FIG. 11, for example, a computer-accessible medium 1106 (e.g., as described herein above, a storage device such as a hard disk, floppy disk, memory stick, CD-ROM, RAM, ROM, etc., or a collection thereof) can be provided (e.g., in communication with the processing arrangement 1102). The computer-accessible medium 1106 can contain executable instructions 1108 thereon. In addition or alternatively, a storage arrangement 1110 can be provided separately from the computer-accessible medium 1106, which can provide the instructions to the processing arrangement 1102 so as to configure the processing arrangement to execute certain exemplary procedures, processes and methods, as described herein above, for example.

Further, the exemplary processing arrangement 1102 can be provided with or include an input/output arrangement 1114, which can include, for example, a wired network, a wireless network, the internet, an intranet, a data collection probe, a sensor, etc. As shown in FIG. 11, the exemplary processing arrangement 1102 can be in communication with an exemplary display arrangement 1112, which, according to certain exemplary embodiments of the present disclosure, can be a touch-screen configured for inputting information to the processing arrangement in addition to outputting information from the processing arrangement, for example. Further, the exemplary display 1112 and/or a storage arrangement 1110 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entirety.

[1] "International Technology Roadmap for Semiconductors." http://www.itrs.net/Links/2011 ITRS/Home2011.htm.

[2] DIGITIMES Research, "Trends in the global IC design service market." http://www.digitimes.com/Reports/Report.asp?datepublish=2012/3/13\&pages=RS\&seq=400\&read=toc.

[3] Intelligence Advanced Research Projects Activity, "Trusted Integrated Circuits Program." https://www.fbo.gov/utils/view?id=b8be3d2c5d5babbdffc6975c370247a6.

[4] J. Roy, F. Koushanfar, and I. Markov, "EPIC: Ending Piracy of Integrated Circuits," Proceedings of the IEEE/ACM Design, Automation and Test in Europe, pp. 1069-1074, 2008.

[5] R. Chakraborty and S. Bhunia, "HARPOON: An Obfuscation-Based SoC Design Methodology for Hardware Protection," IEEE Transactions on Computer-Aided Design of Integrated Circuits and Systems, vol. 28, no. 10, pp. 1493-1502, 2009. [6] SEMI, "Innovation is at risk as semiconductor equipment and materials industry loses up to $4 billion annually due to IP infringement." www.semi.org/en/Press/P043775, 2008.

[7] Chipworks, "Intel's 22-nm Tri-gate Transistors Exposed." http://www.chipworks.com/blog/technology-blog/2012/04/23/intels-22-nm-tri-gate-transistors-exposed/, 2012.

[8] R. Torrance and D. James, "The state-of-the-art in semiconductor reverse engineering," Proc. of IEEE/ACM Design Automation Conference, pp. 333-338, 2011.
[9] ExtremeTech, "iPhone 5 A6 SoC reverse engineered, reveals rare hand-made custom CPU, and tri-core GPU." http://www.extremetech.com/computing/36749-iphone-5-a6-soc-reverse-engineered-reveals-rare-hand-made-custom-cpu-and-a-tri-core-gpu.
[10] Silicon Zoo, "The layman's guide to ic reverse engineering." http://siliconzoo.org/tutorial.html.
[11] Chipworks, "Reverse engineering software." http://www.chipworks.com/en/technical-competitive-analysis/resources/reerse-engineering-software.
[12] Degate. http://www.degate.org/documentation/.
[13] SypherMedia, "Syphermedia library circuit camouflage technology." http://www.smi.tv/solutions.htm.
[14] R. Torrance and D. James, "The state-of-the-art in ic reverse engineering," in the Proc. of Cryptographic Hardware and Embedded Systems, pp. 363-381, 2009.
[15] W. M. V. Fleet and M. R. Dransfield, "Method of recovering a gate-level netlist from a transistor-level," U.S. Pat. No. 6,190,433, 1998.
[16] M. Hansen, H. Yalcin, and J. Hayes, "Unveiling the ISCAS-85 benchmarks: a case study in reverse engineering," IEEE Design Test of Computers, vol. 16, no. 3, pp. 72-80, 1999.
[17] W. Li, Z. Wasson, and S. Seshia, "Reverse engineering circuits using behavioral pattern mining," in the Proc. of IEEE International Symposium on Hardware-Oriented Security and Trust, pp. 83-88, 2012.
[18] P. Subramanyan, N. Tsiskaridze, K. Pasricha, D. Reisman, A. Susnea, and S. Malik, "Reverse engineering digital circuits using functional analysis," in the Proc. of IEEE/ACM Design Automation and Test in Europe, 2013.
[19] J. P. Baukus, L. W. Chow, R. P. Cocchi, and B. J. Wang, "Method and apparatus for camouflaging a standard cell based integrated circuit with micro circuits and post processing," US Patent No. 20120139582, 2012.
[20] J. P. Baukus, L. W. Chow, R. P. Cocchi, P. Ouyang, and B. J. Wang, "Building block for a secure cmos logic cell library," U.S. Pat. No. 8,111,089, 2012.
[21] J. P. Baukus, L. W. Chow, and W. Clark, "Integrated circuits protected against reverse engineering and method for fabricating the same using an apparent metal contact line terminating on field oxide," US Patent no. 20020096776, 2002.
[22] J. P. Baukus, L. W. Chow, R. P. Cocchi, P. Ouyang, and B. J. Wang, "Camouflaging a standard cell based integrated circuit," U.S. Pat. No. 8,151,235, 2012.
[23] J. P. Baukus, L.-W. Chow, J. W. M. Clark, and G. J. Harbison, "Conductive channel pseudo block process and circuit to inhibit reverse engineering," U.S. Pat. No. 8,258,583, 2012.
[24] M. L. Bushnell and V. D. Agrawal, "Essentials of Electronic Testing for Digital, Memory, and Mixed-Signal VLSI Circuits," Kluwer Academic Publishers, Boston, 2000.
[25] A. Kahng, J. Lach, W. Mangione-Smith, S. Mantik, I. Markov, M. Potkonjak, P. Tucker, H. Wang, and G. Wolfe, "Watermarking techniques for intellectual property protection," in the Proc. of IEEE/ACM Design Automation Conference, pp. 776-781, 1998.
[26] F. Koushanfar, I. Hong, and M. Potkonjak, "Behavioral synthesis techniques for intellectual property protection," ACM Transactions on Design Automation of Electronic Systems, vol. 10, no. 3, pp. 523-545, 2005.
[27] A. Kahng, S. Mantik, I. Markov, M. Potkonjak, P. Tucker, H. Wang, and G. Wolfe, "Robust IP watermarking methodologies for physical design," in the Proc. of Design Automation Conference, pp. 782-787, 1998.
[28] Y. Alkabani and F. Koushanfar, "Active hardware metering for intellectual property protection and security," Proceedings of USENIX security, pp. 291-306, 2007.
[29] G. Suh and S. Devadas, "Physical Unclonable Functions for Device Authentication and Secret Key Generation," Proceedings of the IEEE/ACM Design Automation Conference, pp. 9-14, 2007.
[30] J. Lee, D. Lim, B. Gassend, G. Sub, M. van Dijk, and S. Devadas, "A technique to build a secret key in integrated circuits for identification and authentication applications," in the Proc. of IEEE International Symposium on VLSI Circuits, pp. 176-179, 2004.

What is claimed is:

1. A non-transitory computer-accessible medium including instructions thereon for camouflaging at least one logic gate in at least one integrated circuit, wherein, when a computer hardware arrangement executes the instructions, the computer arrangement is configured to perform procedures comprising:
   determining at least one camouflaging location of the at least one logic gate using (i) a fault analysis procedure to model an incorrect reverse engineering configuration, and (ii) a fault simulation procedure to determine an effect of the incorrect reverse engineering configuration on at least one output of the at least one integrated circuit; and
   camouflaging the at least one logic gate at the at least one location based on the determination.

2. The computer-accessible medium of claim 1, wherein the computer arrangement is further configured to perform the camouflaging procedure by replacing the at least one logic gate at the at least one camouflaging location with at least one further camouflaged gate which has at least one of at least one dummy contact or at least one vias.

3. The computer-accessible medium of claim 1, wherein the at least one camouflaged gate is configured to corrupt a functionality of the at least one integrated circuit after being incorrectly reverse engineered as a logic gate type that is different from the at least one logic gate.

4. The computer-accessible medium of claim 3, wherein the at least one logic gate is a plurality of logic gates, and wherein a number of the logic gates to be camouflaged is based on a number of outputs of the at least one integrated circuit that becomes corrupted during the reverse engineering.

5. The computer-accessible medium of claim 4, wherein the number of corrupted outputs is about 50% of a total number of the outputs.

6. The computer-accessible medium of claim 1, wherein the computer arrangement is further configured to perform the camouflaging procedure using at least one interference graph.

7. The computer-accessible medium of claim 6, wherein the computer arrangement is further configured to determine the at least one camouflaging location based on a clique analysis procedure performed on the interference graph.

8. The computer-accessible medium of claim 7, wherein the computer arrangement is further configured to enhance an encryption of the at least one integrated circuit using at least one substantially maximally-sized clique of the clique analysis procedure.

9. The computer-accessible medium of claim 8, wherein each of the at least one clique represents a set of non-resolvable and interfering camouflaged gates in a netlist.

10. The computer-accessible medium of claim 6, wherein the at least one interference graph includes (i) at least one node related to the at least one camouflaging location, and (ii) at least one graph edge that is based on a degree of erasability of an effect of the at least one camouflaging location at least one of in or on at least one further camouflaging location.

11. The computer-accessible medium of claim 10, wherein the at least one node represents a non-resolvable and interfering camouflaged gate.

12. The computer-accessible medium of claim 11, wherein the at least one node is two nodes, and the nodes are connected by that at least one graph edge if the corresponding non-resolvable and interfering camouflaged gates protect each other.

13. The computer-accessible medium of claim 6, wherein the computer arrangement is further configured to generate the at least one interference graph based at least in part on an effect of the plurality of camouflaging locations on at least one further camouflaging location of the at least one integrated circuit.

14. The computer-accessible medium of claim 1, wherein the computer arrangement is further configured:
 evaluate a plurality of camouflaging locations using the fault simulation procedure; and
 select at least two of the camouflaging locations for placement of the at least one camouflaged logic gate.

15. The computer-accessible medium of claim 14, wherein the selection of the camouflaging locations is performed using at least one of a Hamming Distance or Avalanche Criterion goals.

16. The computer-accessible medium of claim 1, wherein the computer arrangement is further configured to determine the at least one camouflaging location based on an interference between two or more logic gates.

17. The computer-accessible medium of claim 16, wherein the computer arrangement is further configured to determine the interference based on a first camouflaging location of a first logic gate of the two or more logic gates blocking a further camouflaging location of a further logic gate of the two or more logic gates.

18. The computer-accessible medium of claim 16, wherein the computer arrangement is further configured to determine the interference based on a first output of a first logic gate of the two or more logic gates at a first camouflaging location and a second output of a second logic gate of the two or more logic gates at a second camouflaging location converging at a further camouflaging location of a further logic gate of the two or more logic gates.

19. The computer-accessible medium of claim 1, wherein the computer arrangement is further configured to watermark the at least one integrated circuit.

20. A method for camouflaging at least one logic gate in at least one integrated circuit comprising:
 determining at least one camouflaging location of the at least one logic gate using (i) a fault analysis procedure to model an incorrect reverse engineering configuration, and (ii) a fault simulation procedure to determine an effect of the incorrect reverse engineering configuration on at least one output of the at least one integrated circuit; and
 using a computer hardware arrangement, camouflaging the at least one logic gate in the at least one location based on the determination.

21. A system for camouflaging at least one logic gate in at least one integrated circuit comprising:
 a computer hardware arrangement configured to:
  determine at least one camouflaging location of the at least one logic gate using (i) a fault analysis procedure to model an incorrect reverse engineering configuration, and (ii) a fault simulation procedure to determine an effect of the incorrect reverse engineering configuration on at least one output of the at least one integrated circuit; and
  camouflage the at least one logic gate in the at least one location based on the determination.

* * * * *